(12) United States Patent
Lin

(10) Patent No.: US 6,665,168 B2
(45) Date of Patent: Dec. 16, 2003

(54) ELECTROSTATIC CHUCK APPARATUS AND METHOD FOR EFFICIENTLY DECHUCKING A SUBSTRATE THEREFROM

(75) Inventor: Ruey Horng Lin, Yong Ho (TW)

(73) Assignee: Taiwan Semiconductor Manufacturing Co. Ltd, Hsin Chu (TW)

( * ) Notice: Subject to any disclaimer, the term of this patent is extended or adjusted under 35 U.S.C. 154(b) by 271 days.

(21) Appl. No.: 09/822,750

(22) Filed: Mar. 30, 2001

(65) Prior Publication Data

US 2002/0141132 A1 Oct. 3, 2002

(51) Int. Cl.[7] ............................................. H02N 13/00
(52) U.S. Cl. ....................................................... 361/234
(58) Field of Search ........................ 361/234; 279/128; 269/8, 903

(56) References Cited

U.S. PATENT DOCUMENTS

| | | | |
|---|---|---|---|
| 5,790,365 A | 8/1998 | Shel | ........................... 361/234 |
| 5,815,366 A * | 9/1998 | Morita et al. | ................ 361/234 |
| 5,880,924 A | 3/1999 | Kumar et al. | ................ 361/234 |
| 5,900,062 A | 5/1999 | Loewenhardt et al. | ....... 361/234 |

* cited by examiner

Primary Examiner—Ronald W. Leja
(74) Attorney, Agent, or Firm—Tung & Associates

(57) ABSTRACT

Within both a electrostatic chuck apparatus and a method for fabricating a substrate while employing a fabrication apparatus having assembled therein the electrostatic chuck apparatus there is employed: (1) an electrostatically energizable substrate plate sized to accommodate a substrate; and (2) an electrically conductive lift pin movably positionable with respect to the electrostatically energizable substrate plate such as to optionally contact and lift the substrate when positioned upon the electrostatically energizable substrate plate, further wherein the electrically conductive lift pin is connected to ground through a switch. Both the electrostatic chuck apparatus and the method provide for more efficient dechucking of the substrate positioned and electrostatically fixed upon the electrostatic chuck apparatus.

8 Claims, 2 Drawing Sheets

ELECTROSTATIC CHUCK APPARATUS AND METHOD FOR EFFICIENTLY DECHUCKING A SUBSTRATE THEREFROM

BACKGROUND OF THE INVENTION

1. Field of the Invention

The present invention relates generally to apparatus and methods for dechucking substrates from electrostatic chucks. More particularly, the present invention relates to apparatus and methods for efficiently dechucking substrates from electrostatic chucks.

2. Description of the Related Art

Microelectronic fabrications are formed from microelectronic substrates over which are formed patterned microelectronic conductor layers which are separated by microelectronic dielectric layers.

Within the fabrication of microelectronic fabrications, and in particular within the fabrication of semiconductor integrated circuit microelectronic fabrications, there are employed various fabrication processes which in general require that a microelectronic fabrication substrate be held in a fixed position within a microelectronic fabrication apparatus under circumstances where the microelectronic fabrication substrate is fabricated, or otherwise processed, within the microelectronic fabrication apparatus. Examples of such microelectronic fabrication processes include, but are not limited to, microelectronic fabrication inspection processes, microelectronic fabrication spin coating processes, microelectronic fabrication vacuum etch processes and microelectronic fabrication vacuum deposition processes.

In order to hold a microelectronic fabrication substrate in a fixed position with respect to a microelectronic fabrication apparatus when fabricating or otherwise processing the microelectronic fabrication substrate within the microelectronic fabrication apparatus, there is often employed within the microelectronic fabrication apparatus an electrostatic chuck upon which the microelectronic fabrication substrate is positioned and fixed by action of an electrostatic charge introduced within the electrostatic chuck. As is understood by a person skilled in the art, the electrostatic charge introduced within the electrostatic chuck concurrently induces a corresponding complementary electrostatic charge within the microelectronic fabrication substrate positioned, electrically isolated, and thus electrostatically fixed, upon the electrostatic chuck.

While electrostatic chucks are thus clearly desirable in the art of microelectronic fabrication for fixing a position of a microelectronic fabrication substrate with respect to a microelectronic fabrication apparatus when fabricating or otherwise processing the microelectronic fabrication substrate, electrostatic chucks are nonetheless not entirely without problems in the art of microelectronic fabrication when employed for fixing a position of a microelectronic fabrication substrate with respect to a microelectronic fabrication apparatus when fabricating or otherwise processing the microelectronic fabrication substrate. In that regard, when employing within the art of microelectronic fabrication an electrostatic chuck for purposes of fixing a position of a microelectronic fabrication substrate with respect to a microelectronic fabrication apparatus when fabricating or otherwise processing a microelectronic fabrication substrate, it is often difficult to remove (i.e., dechuck) the microelectronic fabrication substrate from the electrostatic chuck after having fabricated or otherwise processed the microelectronic fabrication substrate within the microelectronic fabrication apparatus, typically insofar as it is often difficult to fully and efficiently dissipate an electrostatic charge within the microelectronic fabrication substrate positioned and electrostatically fixed upon the electrostatic chuck.

It is thus desirable in the art of microelectronic fabrication to provide electrostatic chuck apparatus and electrostatic chuck dechucking methods which provide for more efficient dechucking of microelectronic fabrication substrates from electrostatic chucks.

It is towards the foregoing object that the present invention is more specifically directed.

Various electrostatic chuck apparatus and electrostatic chuck dechucking methods have been disclosed within arts including but not limited to microelectronic fabrication arts for assisting in removal of substrates, including but not limited to microelectronic fabrication substrates, from electrostatic chucks.

Representative electrostatic chuck apparatus and electrostatic chuck dechucking methods are disclosed within, but not limited to: (1) Shel, U.S. Pat. No. 5,790,365 (an electrostatic chuck apparatus and an electrostatic chuck dechucking method which employ an inductor/intrinsic capacitor tank circuit to assist in dechucking of a substrate from an electrostatic chuck); (2) Kumar et al., U.S. Pat. No. 5,880,924 (an electrostatic chuck apparatus and an electrostatic chuck dechucking method which employ within an electrostatic chuck: (1) a fixed charging electrode for generating an electrostatic charge within the electrostatic chuck and a substrate positioned and fixed upon the electrostatic chuck; and (2) a separate fixed discharge electrode for dissipating the electrostatic charge from within the electrostatic chuck and the substrate positioned and fixed upon the electrostatic chuck); (3) Lowenhardt et al., U.S. Pat. No. 5,900,062 (an electrostatic chuck apparatus and an electrostatic chuck dechucking method which employ a conductive lift pin connected to electrical ground through a radio frequency current filter or a resistive radio frequency voltage attenuator to assist in dechucking of a substrate from an electrostatic chuck); and (4) Brown, U.S. Pat. No. 6,104,595 (an electrostatic chuck apparatus and an electrostatic chuck dechucking method which employ a photoconductive material for fabricating an electrostatic chuck such as to photo-facilitatively assist in dechucking a substrate from an electrostatic chuck).

Desirable within arts including but not limited to microelectronic fabrication arts are additional electrostatic chuck apparatus and electrostatic chuck dechucking methods which provide for efficient dechucking of substrates from electrostatic chucks.

It is towards the foregoing object that the present invention is more generally directed.

SUMMARY OF THE INVENTION

A first object of the present invention is to provide an electrostatic chuck apparatus and an electrostatic chuck dechucking method for dechucking a substrate from an electrostatic chuck which comprises the electrostatic chuck apparatus.

A second object of the present invention is to provide the electrostatic chuck apparatus and the electrostatic chuck dechucking method in accord with the first object of the present invention, wherein there is provided an efficient dechucking of the substrate from the electrostatic chuck which comprises the electrostatic chuck apparatus.

A third object of the present invention is to provide the electrostatic chuck apparatus and the electrostatic chuck dechucking method in accord with the first object of the present invention and the second object of the present invention, wherein the electrostatic chuck apparatus is readily fabricated and the electrostatic chuck dechucking method is readily commercially implemented.

In accord with the objects of the present invention, there is provided by the present invention an electrostatic chuck apparatus and a method for fabricating a substrate while employing a fabrication apparatus having assembled therein the electrostatic chuck apparatus.

To practice the method of the present invention, there is first provided a fabrication tool having assembled therein an electrostatic chuck apparatus comprising: (1) an electrostatically energizable substrate plate sized to accommodate a substrate; and (2) an electrically conductive lift pin movably positionable with respect to the electrostatically energizable substrate plate such as to optionally contact and lift the substrate when positioned upon the electrostatically energizable substrate plate. Within the present invention, the electrically conductive lift pin is connected to ground through a switch. There is then positioned the substrate upon the electrostatically energizable substrate plate with the electrically conductive lift pin not contacting the substrate and with the switch open. There is also electrostatically energized the electrostatically energizable substrate plate. There is then fabricated the substrate while employing the fabrication tool at least in part with the electrostatically energizable substrate plate electrostatically energized. Finally, there is then repositioned the electrically conductive lift pin to contact the substrate, while closing the switch.

The method for fabricating the substrate while employing the fabrication apparatus having assembled therein the electrostatic chuck apparatus in accord with the present invention contemplates the electrostatic chuck apparatus which may be employed within the method for fabricating the substrate while employing the fabrication apparatus having assembled therein the electrostatic chuck apparatus in accord with the present invention.

The present invention provides an electrostatic chuck apparatus and a method for fabricating a substrate while employing a fabrication apparatus having assembled therein the electrostatic chuck apparatus, wherein there is provided efficient dechucking of the substrate positioned and fixed upon an electrostatic chuck which comprises the electrostatic chuck apparatus.

The present invention realizes the foregoing objects by employing when fabricating a substrate while employing a fabrication apparatus having assembled therein the electrostatic chuck apparatus, and in particular with respect to the electrostatic chuck apparatus: (1) an electrostatically energizable substrate plate sized to accommodate a substrate; and (2) an electrically conductive lift pin movably positioned with respect to the electrostatically energizable substrate plate such as to optionally contact and lift the substrate when positioned upon the electrostatically energizable substrate plate, further where the electrically conductive lift pin is connected to ground through a switch. By employing when fabricating the substrate while employing the fabrication apparatus having assembled therein the electrostatic chuck apparatus in accord with the present invention the foregoing: (1) electrostatically energizable substrate plate; and (2) electrically conductive lift pin, and incident to: (1) positioning the substrate upon the electrostatically energizable substrate plate; (2) electrostatically energizing the electrostatically energizable substrate plate; (3) fabricating the substrate with the electrically conductive lift pin not contacting the substrate and with the switch open; and (4) deenergizing the electrostatically energizable substrate plate; (5) the electrically conductive lift pin may be repositioned to contact the substrate, while closing the switch, such as to effect a more efficient dechucking of the substrate from an electrostatic chuck (i.e., the electrostatically energizable substrate plate) which comprises the electrostatic chuck apparatus.

The electrostatic chuck apparatus of the present invention is readily fabricated and the electrostatic chuck apparatus dechucking method of the present invention is readily commercially implemented.

The present invention employs fabrication apparatus components as are otherwise generally known within arts including but not limited to microelectronic fabrication arts, or generally available within arts including but not limited to microelectronic fabrication arts, but employed within the context of a specific electrostatic chuck apparatus construction of the present invention employed within a specific electrostatic chuck apparatus dechucking method of the present invention. Since it is thus at least in part a specific assemblage of components which provides at least in part the present invention, rather than the existence of specific components which provides the present invention, the electrostatic chuck apparatus of the present invention is readily fabricated and the electrostatic chuck apparatus dechucking method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

Figure 1:
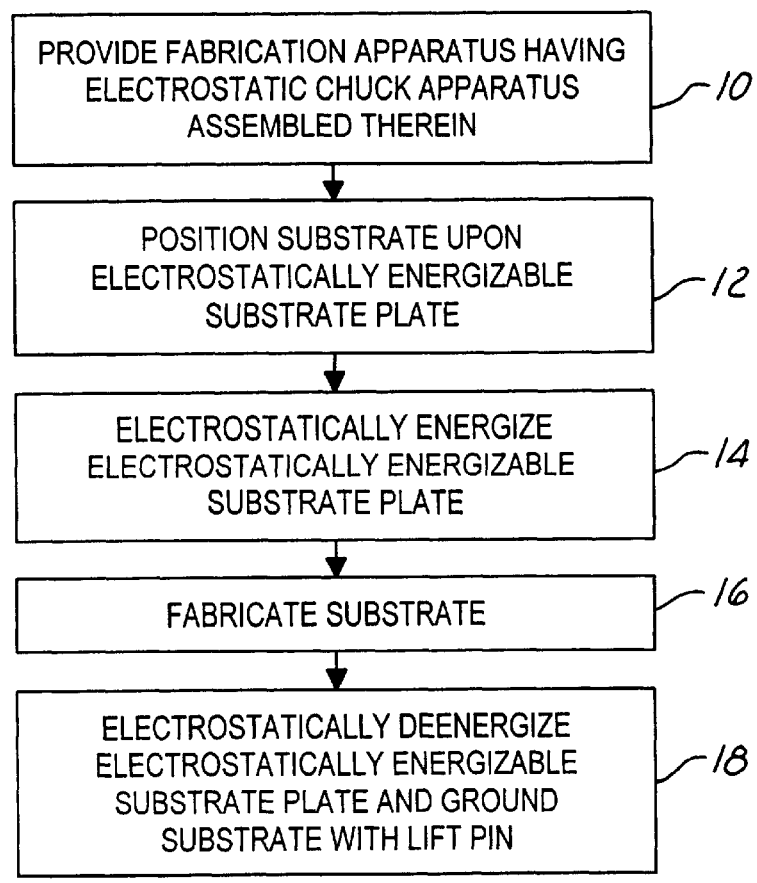
FIG. 1 shows a schematic process flow diagram illustrating progressive stages in the electrostatic chuck apparatus dechucking method of the present invention.

The present invention provides an electrostatic chuck apparatus and a method for fabricating a substrate while employing a fabrication apparatus having assembled therein the electrostatic chuck apparatus, wherein there is provided efficient dechucking of the substrate positioned and fixed upon an electrostatic chuck which comprises the electrostatic chuck apparatus.

The present invention realizes the foregoing objects by employing when fabricating a substrate while employing a fabrication apparatus having assembled therein the electrostatic chuck apparatus, and in particular with respect to the electrostatic chuck apparatus: (1) an electrostatically energizable substrate plate sized to accommodate a substrate; and (2) an electrically conductive lift pin movably positioned with respect to the electrostatically energizable substrate plate such as to optionally contact and lift the substrate when positioned upon the electrostatically energizable substrate plate, further where the electrically conductive lift pin is connected to ground through a switch. By employing when fabricating the substrate while employing the fabrication apparatus having assembled therein the electrostatic chuck apparatus in accord with the present invention the foregoing: (1) electrostatically energizable substrate plate; and (2) electrically conductive lift pin, and incident to: (1) positioning the substrate upon the electrostatically energizable substrate plate; (2) electrostatically energizing the electrostatically energizable substrate plate; (3) fabricating the substrate with the electrically conductive lift pin not contacting the substrate and the switch open; and (4) deenergizing the electrostatically energizable substrate plate; (5) the electrically conductive lift pin may be repositioned to contact the substrate, while closing the switch, such as to effect a more efficient dechucking of the substrate from an electrostatic chuck (i.e., the electrostatically energizable substrate plate) which comprises the electrostatic chuck apparatus.

Although the present invention provides particular value within the context of fabricating a microelectronic fabrication substrate while employing an electrostatic chuck apparatus in accord with the present invention, the present invention may nonetheless also be employed for fabricating, while employing the electrostatic chuck apparatus of the present invention, fabrications including but not limited to functional fabrications in general, decorative fabrications in general and microelectronic fabrications more specifically. Similarly, within the context of microelectronic fabrications more specifically, the present invention may be employed for fabricating microelectronic fabrications including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Referring now to FIG. 1, there is shown a schematic process flow diagram illustrating progressive stages in the electrostatic chuck apparatus dechucking method of the present invention.

Shown in FIG. 1, and in accord with the process step which corresponds with reference numeral 10, there is first provided a fabrication apparatus having assembled therein an electrostatic chuck apparatus in accord with the present invention.

Within the preferred embodiment of the present invention with respect to the fabrication apparatus, and as noted above, the fabrication apparatus may be employed for fabricating fabrications including but not limited to functional fabrications generally, decorative fabrications generally and microelectronic fabrications more specifically. Similarly, and in particular as is also noted above, the fabrication apparatus is typically and preferably employed for fabricating a microelectronic fabrication more specifically, and a semiconductor integrated circuit microelectronic fabrication most specifically.

Within the preferred embodiment of the present invention with respect to the electrostatic chuck apparatus, the electrostatic chuck apparatus comprises: (1) an electrostatically energizable substrate plate sized to accommodate a substrate (which by itself may be viewed as an "electrostatic chuck"); and (2) an electrically conductive lift pin movably positionable with respect to the electrostatically energizable substrate plate such as to optionally contact and lift the substrate when positioned upon the electrostatically energizable substrate plate, further wherein the electrically conductive lift pin is connected to ground through a switch.

Within the preferred embodiment of the present invention with respect to the electrostatically energizable substrate plate which in part comprises the electrostatic chuck apparatus, the electrostatically energizable substrate plate typically and preferably comprises: (1) at least in part a conductive substrate plate, having formed thereover; (2) at least in part an insulating layer, as is otherwise generally conventional in the art of electrostatic chuck fabrication, and disclosed in greater detail, and in general, within the Related Art references disclosed within the Description of the Related Art, the disclosures of all of which Related Art references are incorporated herein fully by reference.

Similarly, within the preferred embodiment of the present invention with respect to the electrically conductive lift pin which is movably positionable with respect to the electrostatically energizable substrate plate such as to optionally contact and lift the substrate when positioned upon the electrostatically energizable substrate plate, the electrically conductive lift pin may also be fabricated employing methods and materials as are generally illustrated within various of the Related Art references as cited within the Description of the Related Art.

Referring again to FIG. 1, and in accord with the block which corresponds with reference numeral 12, there is shown the next process step in accord with the electrostatic chuck apparatus dechucking method of the present invention.

In accord with the block which corresponds with reference numeral 20 there is next positioned upon the electrostatically energizable substrate plate a substrate. Similarly in accord with the above, the substrate may be a substrate employed when fabricating a fabrication selected from the group including but not limited to functional fabrications in general, decorative fabrications in general and microelectronic fabrications more specifically. As is also understood by a person skilled in the art, when positioning the substrate upon the electrostatically energizable substrate plate, the lift pin (or more particularly a series of at least three lift pins and more preferably at least four lift pins), may be employed to receive the substrate and then be retracted within the electrostatically energizable substrate plate such as to position the substrate upon the electrostatically energizable substrate plate.

Referring again to FIG. 1 and in accord with the block which corresponds with reference numeral 14, there is shown the next process step in accord with the electrostatic chuck apparatus dechucking method of the present invention.

In accord with the block which corresponds with reference numeral 14, there is then electrostatically energized the electrostatically energizable substrate plate.

Within the preferred embodiment of the present invention with respect to electrostatically energizing the electrostatically energizable substrate plate, the electrostatically energizable substrate plate may be electrostatically energized, typically and preferably while employing an electrostatic voltage. As is understood by a person skilled in the art, incident to electrostatically energizing the electrostatically energizable substrate plate, there is induced within the substrate positioned thereupon a corresponding complementary electrostatic charge which fixes the substrate within the position within which it is positioned upon the electrostatically energizable substrate plate. Also within the context of the present invention, at least in part when electrostatically energizing the electrostatically energizable substrate plate, the lift pin is not in contact with the substrate and the switch is open.

Referring again to FIG. 1, and in accord with the block which corresponds with reference numeral 16, there is shown the next process step in accord with the electrostatic chuck apparatus dechucking method of the present invention.

As is illustrated within the block which corresponds with reference numeral 16, the substrate is fabricated within the fabrication apparatus. Within the preferred embodiment of the present invention, the substrate may be fabricated within the fabrication apparatus with respect to fabrication processes including but not limited to inspection fabrication processes, spin coating fabrication processes, vacuum etching fabrication processes and vacuum deposition fabrication processes.

Within the preferred embodiment of the present invention, and in accord with the process step which corresponds with reference numeral 14, the substrate is also fabricated within the fabrication tool, at least in part, with the lift pin not in contact with the substrate and with the switch open. By fabricating within the context of the present invention the substrate within the fabrication tool with the lift pin not in contact with the substrate and with the switch open, there is avoided within the context of the present invention any electrical leakage through the lift pin to ground when fabricating the substrate within the fabrication tool. Such avoidance of electrical leakage is particularly important when employing for fabricating the substrate within the fabrication apparatus an energetic method, such as but not limited to an energetic plasma method, since otherwise the energetic method might provide for dissipated energy within the energetic method employed for fabricating the substrate.

Referring finally again to FIG. 1, and in accord with the block which corresponds with reference numeral 18, there is shown the last process step in accord with the electrostatic chuck apparatus dechucking method of the present invention.

As is shown within the block which corresponds with reference numeral 18, there is electrostatically deenergized the electrostatically energizable substrate plate and grounded the substrate with the lift pin.

Within the preferred embodiment of the present invention with respect to electrostatically deenergizing the electrostatically energizable substrate plate, the electrostatically energizable substrate plate is typically and preferably electrostatically deenergized by extinguishing an electrostatically energizing voltage impressed upon the electrostatically energizable substrate plate and concurrently grounding the electrostatically energizable substrate plate.

Within the preferred embodiment of the present invention with respect to grounding the substrate with the lift pin, the substrate is grounded with the lift pin incident to both contacting the substrate with the lift pin and closing the switch. Upon grounding the substrate with the lift pin, there is provided for dissipation of the charge induced within the substrate, particularly under circumstances where the substrate is formed of a conductive material or a semiconductive material. Thus, and in accord with the objects of the present invention, the substrate may be more efficiently dechucked from the electrostatically energizable substrate plate.

Referring now to FIG. 2 to FIG. 5, there is shown a series of schematic cross-sectional diagrams illustrating the results of progressive stages in fabricating a substrate positioned upon an electrostatic chuck apparatus within a fabrication apparatus in accord with the method of the present invention.

Figure 2:
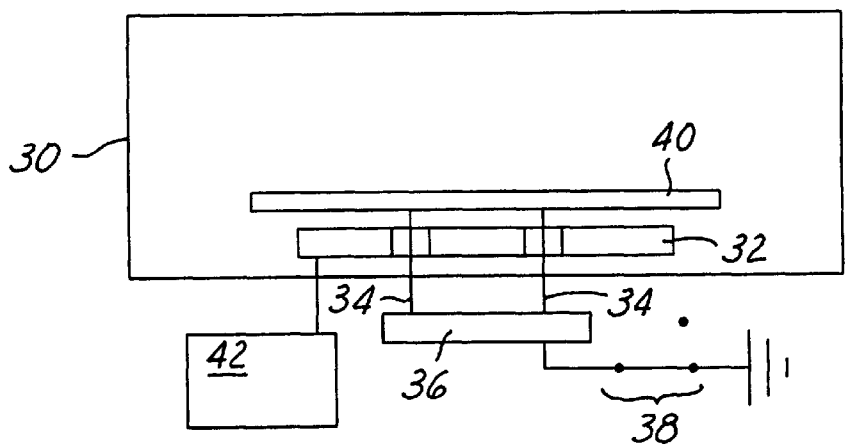
FIG. 2, FIG. 3, FIG. 4 and FIG. 5 show a series of schematic cross-sectional diagrams illustrating progressive stages in fabrication of a substrate positioned upon an electrostatic chuck apparatus within a fabrication apparatus in accord with the method of the present invention.

Shown in FIG. 2 is a schematic cross-sectional diagram illustrating the substrate positioned upon the electrostatic chuck apparatus within the fabrication apparatus at an early stage in its fabrication in accord with the method of present invention.

Shown in FIG. 2 is a reactor chamber 30 having positioned therein an electrostatically energizable substrate plate 32. Within the schematic cross-sectional diagram of FIG. 2, the electrostatically energizable substrate plate 32 has formed therethrough a plurality of bores (typically and preferably at least 3 (areally distributed) and more typically and preferably at least four (areally distributed), although only two are illustrated within the schematic diagram of FIG. 1) through which are retractably positioned a corresponding plurality of electrically conductive lift pins 34 which in turn support a substrate 40. Within the schematic cross-sectional diagram of FIG. 1, the plurality of electrically conductive lift pins 34 is connected to an electrically conductive carriage 36. As is illustrated within the schematic diagram of FIG. 2, the electrically conductive carriage 36, and thus also the plurality of electrically conductive lift pins 34, are connected to ground through a switch 38 which as is illustrated within the schematic diagram of FIG. 2 is closed. Finally, there is also shown within the schematic diagram of FIG. 2 a power supply 42 electrically connected to the electrostatically energizable substrate plate 32.

Figure 3:
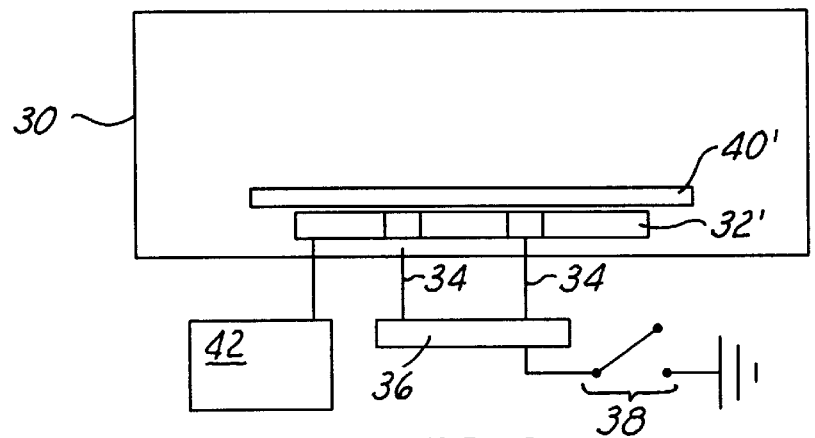

As a related item with respect to the electrostatic chuck apparatus whose schematic cross-sectional diagram is illustrated in FIG. 3, while the plurality of electrically conductive lift pins 34 is connected to ground through the switch 38, there is typically and preferably not employed: (1) within the plurality of electrically conductive lift pins 34; or (2) interposed between the plurality of electrically conductive lift pins 34 and ground either a radio frequency current filter or a resistive radio frequency voltage attenuator in accord with Lowenhardt et al., as referenced within the Description of the Related Art, although either of the above two components as disclosed within Loewenhardt et al. may be employed as indicated. Thus, within the preferred embodiment of the present invention, typically and preferably, the only electrically modifying component interposed between plurality of electrically conductive lift pins and ground is the switch 38.

Referring now to FIG. 3, there is shown a schematic cross-sectional diagram illustrating the results of further processing of the substrate 40 whose schematic cross-sectional diagram is illustrated in FIG. 2.

Shown in FIG. 3 is a schematic cross-sectional diagram of the substrate 40 within the reactor chamber 30 as illustrated within the schematic diagram of FIG. 2, but wherein, in a first instance, the plurality of lift pins 34 has been retracted through the plurality of bores within the electrically energizable substrate plate 32 to thus position the substrate 40 upon the electrostatically energizable substrate plate 32.

Similarly, and as is also illustrated within the schematic diagram of FIG. 3, before, after, incident to or concurrent with retracting the plurality of lift pins 34 through the plurality of bores within the electrostatically energizable substrate plate 32 to thus position the substrate 40 upon the electrostatically energizable substrate plate 32 there is also opened the switch 38 such that neither the electrically conductive carriage 36 nor the plurality of electrically conductive lift pins 34 is any longer connected to ground.

Finally, as is also illustrated within the schematic diagram of FIG. 3, before, after, incident to or concurrent with retracting the plurality of lift pins 34 through the plurality of bores within the electrostatically energizable substrate plate 32 to thus position the substrate 40 upon the electrostatically energizable substrate plate 32 and having opened the switch 38, there is then also electrostatically energized the electrostatically energizable substrate plate 32 to provide an electrostatically energized substrate plate 32' which has positioned thereupon an electrostatically fixed substrate 40', due to charge introduction into the electrostatically energized substrate plate 32' and complementary charge induction within the electrostatically fixed substrate 40'. In accord with the foregoing disclosure, it is thus inherent within the invention that an electrically neutral substrate 40 may be positioned upon the electrostatically energizable substrate plate 32 and electrically separated from the plurality of lift pins 34. The electrically neutral substrate 40 may then be electrostatically energized to provide the electrostatically fixed substrate 40' solely through complementary charge induction when electrostatically energizing the electrostatically energizable substrate plate 32 to form the electrostatically energized substrate plate 32', absent any direct charge introduction into the electrostatically neutral substrate 40 or the electrostatically fixed substrate 40' through the plurality of lift pins 34.

Figure 4:
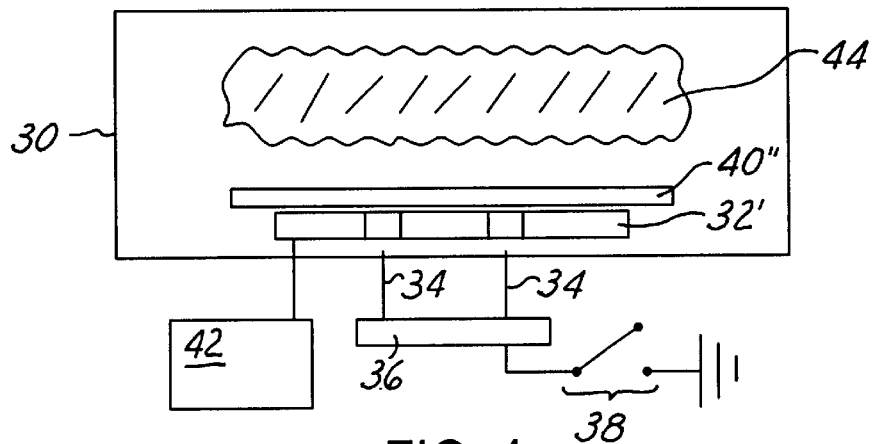

Referring now to FIG. 4, there is shown a schematic cross-sectional diagram illustrating the results of further processing of the electrostatically fixed substrate 40' as illustrated within the schematic cross-sectional diagram of FIG. 3.

Shown in FIG. 4 is a schematic cross-sectional diagram of the electrostatically fixed substrate 40' within the reactor chamber 30 as illustrated within the schematic diagram of FIG. 3, but wherein the electrostatically fixed substrate 40' is treated with a fabrication plasma 44 to form therefrom a fabricated electrostatically fixed substrate 40''.

As is understood by a person skilled in the art, the fabrication plasma 44 may comprise any of several fabrication plasmas as are known in the art of microelectronic fabrication, including but not limited to etch fabrication plasmas and deposition fabrication plasmas.

Of note with respect to the present invention and the preferred embodiment of the present invention is that the electrostatically fixed substrate 40' as illustrated within the schematic cross-sectional diagram of FIG. 3 is fabricated with the fabrication plasma 44 as illustrated within the schematic diagram of FIG. 4 to provide the fabricated electrostatically fixed substrate 40'' at least in part while the plurality of lift pins 34 is retracted from within the plurality of bores within the electrostatically energized substrate plate 32' and similarly also while the switch 38 is open. Under such circumstances, electrical current leakage through the plurality of lift pins 34 to ground is avoided, and thus there is also no parasitic loss of power within the fabrication plasma 44.

Figure 5:
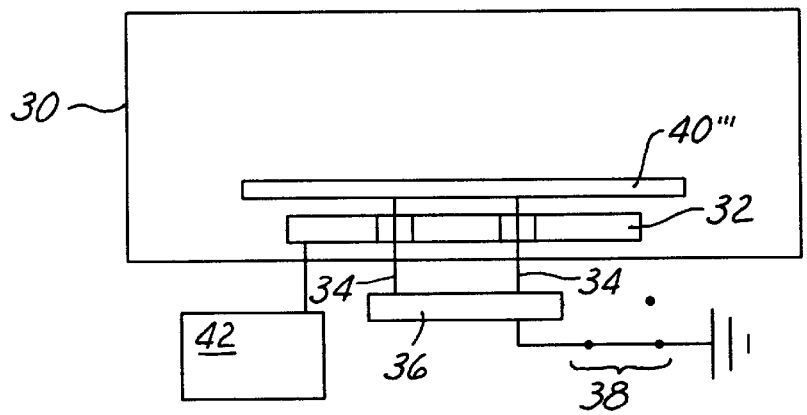

Referring now to FIG. 5, there is shown a schematic cross-sectional diagram illustrating the results of further processing of the fabricated electrostatically fixed substrate 40'' whose schematic cross-sectional diagram is illustrated in FIG. 4.

Shown in FIG. 5 is a schematic cross-sectional diagram of the fabricated electrostatically fixed substrate 40'' within the reactor chamber 30 as illustrated in FIG. 4, but wherein in a first instance the fabrication plasma 44 has been extinguished. As is understood by a person skilled in the art, the fabrication plasma 44 may be extinguished employing any of several methods as are conventional in the art of microelectronic fabrication, which will typically and preferable employ at least in part a reduction of plasma power within the fabrication plasma 44.

As is also illustrated within the schematic diagram of FIG. 5, the electrostatically energized substrate plate 32' as illustrated within the schematic diagram of FIG. 4 has been electrostatically deenergized to again provide the electrostatically energizable substrate plate 32. The electrostatically energizable substrate plate 32' as illustrated within the schematic cross-sectional diagram of FIG. 4 may be electrostatically deenergized to again provide the electrostatically energizable substrate plate 32 while employing methods as are otherwise generally conventional in the art of microelectronic fabrication, which will typically and preferably involve shutting down of the power supply 42 and grounding of the electrostatically energized substrate plate 32'.

Finally, and as is also illustrated within the schematic diagram of FIG. 5, the switch 38 has been closed and the fabricated electrostatically fixed substrate 40' as illustrated within the schematic diagram of FIG. 4 is first grounded by contact with the plurality of electrically conductive lift pins 34 to provide a grounded fabricated substrate 40''' which is further lifted from the electrostatically energizable substrate plate 32 by the plurality of electrically conductive lift pins 34.

As is understood by a person skilled in the art, the grounded fabricated substrate 40''' is readily lifted from the electrostatically energizable substrate plate 32 insofar as the grounded fabricated substrate 40''' is first grounded prior to being lifted from the electrostatically energizable substrate plate 32 by contact with the plurality of electrically conductive lift pins 34 which are connected to ground through the switch 38 which is closed.

As is understood by a person skilled in the art, the preferred embodiment of the present invention is illustrative of the present invention rather than limiting of the present invention. Revisions and modifications may be made to materials, components and dimensions through which is provided an electrostatic chuck apparatus in accord with the present invention and a method for fabricating a substrate while employing a fabrication apparatus having assembled therein the electrostatic chuck apparatus in accord with the present invention, while still providing an electrostatic chuck apparatus in accord with the present invention and a method for fabricating a substrate while employing a fabrication apparatus having assembled therein the electrostatic chuck apparatus in accord with the present invention, further in accord with the accompanying claims.

What is claimed is:

1. A method for fabricating a substrate comprising:
   providing a fabrication tool comprising:
      an electrostatically energizable substrate plate sized to accommodate a substrate; and
      an electrically conductive lift pin movably positionable with respect to the electrostatically energizable substrate plate such as to optionally contact and lift the substrate when positioned upon the electrostatically energizable substrate plate, the electrically conductive lift pin being connected to ground through a switch;
   positioning the substrate upon the electrostatically energizable substrate plate with the electrically conductive lift pin not contacting the substrate and the switch open, while electrostatically energizing the electrostatically energizable substrate plate and inducing a complementary charge within the substrate absent direct charge introduction into the substrate through the electrically conductive lift pin;

fabricating the substrate while employing the fabrication tool with the electrostatically energizable substrate plate electrostatically energized, the lift pin not contacting the substrate and the switch open; and repositioning the electrically conductive lift pin to contact the substrate, while closing the switch.

2. The method of claim 1 wherein the substrate is employed within a fabrication selected from the group consisting of functional fabrications, decorative fabrications and microelectronic fabrications.

3. The method of claim 1 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

4. The method of claim 1 wherein the electrostatically energizable substrate plate comprises a conductive substrate plate having formed thereover an insulator layer.

5. The method of claim 1 wherein the fabrication tool is selected from the group consisting of inspection fabrication tools, spin coating fabrication tools, vacuum etch fabrication tools and vacuum deposition fabrication tools.

6. The method of claim 1 wherein there is not employed integral to the electrically conductive lift pin or interposed between the electrically conductive lift pin and ground a radio frequency current filter.

7. The method of claim 1 wherein there is not employed integral to the electrically conductive lift pin or interposed between the electrically conductive lift pin and ground a resistive radio frequency voltage attenuator.

8. The method of claim further comprising electrostatically deenergizing the electrostatically energizable substrate plate incident to repositioning the electrically conductive lift pin to contact the substrate, while closing the switch.

* * * * *